United States Patent
Takamatsu

(10) Patent No.: US 9,196,854 B2
(45) Date of Patent: Nov. 24, 2015

(54) ORGANIC EL LIGHTING EMITTING DEVICE, METHOD OF MANUFACTURING THE SAME, AND ORGANIC EL LIGHT SOURCE DEVICE

(71) Applicant: Yasuhiko Takamatsu, Hyogo (JP)

(72) Inventor: Yasuhiko Takamatsu, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/196,025

(22) Filed: Mar. 4, 2014

(65) Prior Publication Data

US 2014/0252328 A1    Sep. 11, 2014

(30) Foreign Application Priority Data

Mar. 5, 2013   (JP) ................... 2013-043518

(51) Int. Cl.
*H01L 51/50*  (2006.01)
*H01L 27/32*  (2006.01)
*H01L 51/56*  (2006.01)
*H01L 51/52*  (2006.01)

(52) U.S. Cl.
CPC ........ *H01L 51/5012* (2013.01); *H01L 27/3241* (2013.01); *H01L 51/524* (2013.01); *H01L 51/56* (2013.01)

(58) Field of Classification Search
CPC .. H01L 51/5012; H01L 51/56; H01L 27/3241
USPC ............... 257/40, 59, 72, E21.04, E33.053; 438/34, 26, 28, 97, 733, 795
See application file for complete search history.

(56) References Cited

U.S. PATENT DOCUMENTS

| | | | |
|---|---|---|---|
| 6,798,133 B1 * | 9/2004 | Ambrugger et al. | 313/498 |
| 2002/0132389 A1 * | 9/2002 | Patel et al. | 438/97 |
| 2006/0220550 A1 * | 10/2006 | Harada | 313/512 |
| 2010/0283056 A1 * | 11/2010 | Yasumatsu | 257/59 |

FOREIGN PATENT DOCUMENTS

| | | |
|---|---|---|
| JP | 2000-158704 | 6/2000 |
| JP | 2004-342515 | 12/2004 |
| JP | 2005-178363 | 7/2005 |
| JP | 2006-130713 | 5/2006 |
| JP | 2007-287660 | 11/2007 |
| JP | 2008-181828 | 8/2008 |
| JP | 2009-188461 | 8/2009 |

* cited by examiner

*Primary Examiner* — Sheng Zhu
(74) *Attorney, Agent, or Firm* — Cooper & Dunham LLP

(57) ABSTRACT

An organic EL light emitting device and an organic EL light source device having the organic EL light emitting device are described. A method of manufacturing the organic EL light emitting device includes forming a scaling layer over a sealing layer base material by using at least one of chemical vapor deposition and physical vapor deposition, joining the sealing layer to an organic EL substrate having an organic EL device so as to cover the organic EL device, and removing the sealing layer base material to leave the sealing layer that covers the organic EL device.

5 Claims, 10 Drawing Sheets

ORGANIC EL LIGHTING EMITTING DEVICE, METHOD OF MANUFACTURING THE SAME, AND ORGANIC EL LIGHT SOURCE DEVICE

CROSS-REFERENCE TO RELATED APPLICATIONS

This patent application is based on and claims priority pursuant to 35 U.S.C. §119 to Japanese Patent Application No. 2013-043518, filed on Mar. 5, 2013, in the Japan Patent Office, the entire disclosure of which is hereby incorporated by reference herein.

BACKGROUND

1. Technical Field

The present invention relates to an organic EL light emitting device, a method of manufacturing the same, and an organic EL light source device.

2. Description of the Related Art

An organic EL device typically exhibits a superior characteristic as a low-power-consumption, high-intensity, and self-luminescent device. A light emitting device having such an organic EL device attracts attention as a display device for flat-screen televisions and the like. An application of organic EL light emitting devices as a light emitting head for lighting equipment or printers have also been developed.

There is known a top-emission organic EL device capable of emitting light toward a side opposite of a substrate. In an organic EL light emitting device having the top-emission organic EL device, the organic EL device is sealed by a glass substrate through light is transmitted. The glass substrate has both a moisture permeability resistance and an oxygen permeability resistance.

SUMMARY

Example embodiments of the present invention include a method of manufacturing an organic EL light emitting device includes: forming a sealing layer over a sealing layer base material by using at least one of chemical vapor deposition and physical vapor deposition; joining the sealing layer to an organic EL substrate having an organic EL device so as to cover the organic EL device; and removing the sealing layer base material to leave the sealing layer that covers the organic EL device, the organic EL light emitting device, and an organic EL light source device having the organic EL light emitting device.

DETAILED DESCRIPTION OF THE INVENTION

Figure 1:
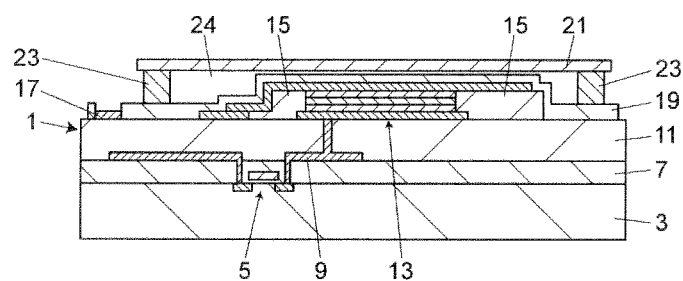
FIG. 1 is a schematic sectional view illustrating an organic EL light emitting device according to an embodiment of the present invention.

In a method of manufacturing an organic EL light emitting device according to an embodiment of the present invention, a sealing layer base material may be made of silicon, and in removing of the sealing layer base material, the sealing layer base material may be removed by etching. With this, it is possible to easily remove the sealing layer base material as compared to a case in which a different material is used as the sealing layer base material. A surface of the sealing layer in contact with the sealing layer base material is made of a material with which etching can be performed selectively to this surface and silicon. Further, the etching may be dry etching or wet etching.

In a method of manufacturing the organic EL light emitting device according to an embodiment of the present invention, the sealing layer having a depressed portion at a position corresponding to a position for providing the organic EL device may be formed over the sealing layer base material, and the sealing layer may be joined at a position on the organic EL substrate different from the position for providing the organic EL device, and the depressed portion may define a void between the organic EL substrate and the sealing layer.

With this, an area of the joining portion between the organic EL substrate and the sealing layer may be reduced. However, the sealing layer does not have to include a depressed portion provided at a position corresponding to a position for providing the organic EL device, and may be flat, for example. Further, the void may not be defined between the organic EL substrate and the sealing layer.

In one embodiment, the organic EL substrate and the sealing layer may be joined by direct joining. With this, as there is no adhesion layer such as an adhesive agent between the organic EL substrate and the sealing layer, it is possible to prevent moisture from coming through the adhesion layer, and to decrease the joining area. However, the organic EL substrate and the sealing layer may be joined by indirect joining using an adhesion layer such as an adhesive agent.

In another embodiment, a drying material for adsorbing moisture may be provided within the depressed portion in the sealing layer before joining the organic EL substrate and the sealing layer. With this, the drying material may be disposed in the void between the organic EL substrate and the sealing layer, and it is possible to prevent the deterioration of the organic EL device due to the moisture and to improve the moisture resistance of the organic EL light emitting device.

In a method of manufacturing the organic EL light emitting device according to an embodiment of the present invention, the sealing layer may be configured as a double-layered structure of a silicon nitride film (SiN) and a silicon dioxide film ($SiO_2$). By providing a silicon nitride film having a superior moisture permeability resistance for the sealing layer, it is possible to improve the moisture resistance of the organic EL light emitting device.

In a method of manufacturing the organic EL light emitting device according to an embodiment of the present invention, the sealing layer may be configured as a three-layered structure of a silicon dioxide film ($SiO_2$), a silicon nitride film (SiN), and a silicon dioxide film ($SiO_2$). By providing a silicon nitride film having a superior moisture permeability resistance for the sealing layer, it is possible to improve the moisture resistance of the organic EL light emitting device. Further, according to this aspect, when a surface of the organic EL substrate to be joined with the sealing layer is made of a silicon dioxide film, silicon dioxide films joined with each other provide the joining portion between the organic EL substrate and the sealing layer. With this, it is possible to improve joining strength between the organic EL substrate and the sealing layer by direct joining, and to provide an organic EL light emitting device with a reduced margin for adhesive at the joining portion between the organic EL substrate and the sealing layer.

In a method of manufacturing the organic EL light emitting device according to an embodiment of the present invention, by using an organic EL substrate base material having regions of a plurality of the organic EL substrates, and the sealing layer base material of a size as large as the organic EL substrate base material, the joining of the sealing layer and the removal of the scaling layer base material may be performed collectively for the regions of the plurality of the organic EL light emitting devices. By forming the sealing layers for the regions of the plurality of organic EL substrates collectively, it is possible to provide an organic EL light emitting device that is highly productive.

After the joining of the sealing layer is performed collectively for the regions of the plurality of the organic EL light emitting devices, etching may be performed for the sealing layer base material and the organic EL substrate base material using dry etching. The removal of the sealing layer base material and dicing of the regions of the plurality of organic EL substrates into pieces may successively be performed. With this, it is possible to provide an organic EL light emitting device with highly-accurate dimensions and high productivity.

The organic EL light emitting device according to one embodiment of the present invention includes: an organic EL substrate having an organic EL device; and a scaling layer joined to the organic EL substrate so as to cover the organic EL device. The sealing layer is formed by one or both of chemical vapor deposition and physical vapor deposition. In the organic EL light emitting device, the organic EL device may be sealed without using a glass substrate as the sealing layer.

In the organic EL light emitting device according to one embodiment of the present invention, a void may be provided between the organic EL substrate and the sealing layer, and a joining portion between the organic EL substrate and the sealing layer may be provided at a position different from a position for providing the organic EL device. With this, an area of the joining portion between the organic EL substrate and the sealing layer can be reduced.

In the organic EL light emitting device according to one embodiment of the present invention, a drying material for adsorbing moisture may be disposed within the void. With this, it is possible to prevent deterioration of the organic EL device due to the moisture, and to improve the moisture resistance of the organic EL light emitting device.

In the organic EL light emitting device according to one embodiment of the present invention, the organic EL substrate and the sealing layer may be joined by direct joining. With this, as there is no adhesion layer such as an adhesive agent between the organic EL substrate and the sealing layer, it is possible to prevent moisture from coming through the adhesion layer, and to decrease the joining area. However, the organic EL substrate and the sealing layer may be joined by indirect joining using an adhesion layer such as an adhesive agent.

In the organic EL light emitting device according to one embodiment of the present invention, the sealing layer may be configured as a double-layered structure of a silicon nitride film (SiN) and a silicon dioxide film ($SiO_2$). By providing a silicon nitride film having a superior moisture permeability resistance for the sealing layer, it is possible to improve the moisture resistance of the organic EL light emitting device.

In the organic EL light emitting device according to one embodiment of the present invention, the sealing layer may be configured as a three-layered structure of a silicon dioxide film ($SiO_2$), a silicon nitride film (SiN), and a silicon dioxide film ($SiO_2$). According to this aspect, when a surface of the organic EL substrate to be joined with the sealing layer is made of a silicon dioxide film, silicon dioxide films joined with each other provide the joining portion between the organic EL substrate and the sealing layer. With this, it is possible to improve joining strength between the organic EL substrate and the sealing layer by direct joining, and to provide an organic EL light emitting device with a reduced margin for adhesive at the joining portion between the organic EL substrate and the sealing layer.

An organic EL light source device according to one embodiment of the present invention includes a plurality of the organic EL light emitting devices that is arranged thereon. However, an application of the organic EL light emitting device is not limited to such an example. According to the other embodiments, it is possible to provide an organic EL light emitting device that is highly productive with low cost and high processing accuracy without using a glass substrate as the sealing layer. Thus, with the organic EL light source device according to one embodiment of the present invention having a plurality of the organic EL light emitting devices arranged thereon, an organic EL light source device with highly-accurate dimensions and high productivity may be achieved.

Hereinafter, embodiments of the present invention will be described with reference to the drawings.

Figure 2:
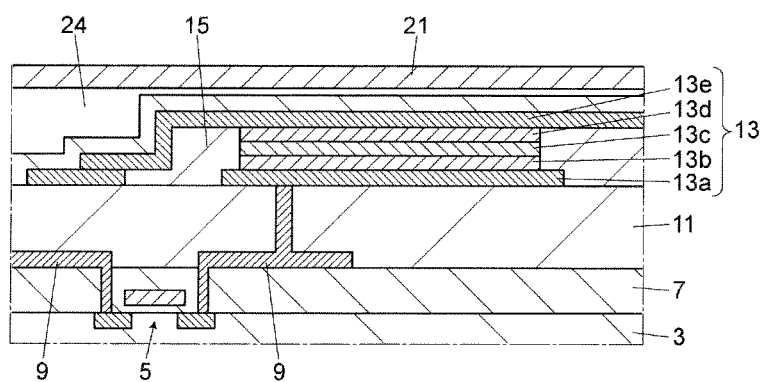
FIG. 2 is a schematic sectional view illustrating an organic EL device forming region on an organic EL substrate of the organic EL light emitting device of FIG. 1.

FIG. 1 is a schematic sectional view illustrating an organic EL light emitting device, according to an embodiment of the present invention. FIG. 2 is a schematic sectional view illustrating an organic EL device forming region on an organic EL substrate according to this embodiment.

In an organic EL substrate 1, a semiconductor device 5 is formed on an organic EL substrate base material 3 made of a semiconductor substrate, for example. The semiconductor device 5 is a transistor, for example. The semiconductor device 5 constitutes a drive circuit of an organic EL device. An insulating film 7 is provided over the organic EL substrate base material 3 so as to cover the semiconductor device 5.

Electrode wiring 9 is provided on the insulating film 7. The electrode wiring 9 is electrically connected to the semiconductor device 5 through a connecting hole provided in the insulating film 7. On the insulating film 7, an insulating film 11 is provided so as to cover the electrode wiring 9.

An organic EL device 13 is provided on the insulating film 11. The organic EL device 13 is configured, for example, such that, an anode 13a, a hole transport layer 13b, a light emitting layer 13c, an electron transport layer 13d, and a cathode 13e are layered in the stated order from a side of the insulating film 11. The organic EL device 13 is of a top-emission type that emits light toward a side opposite of the organic EL substrate base material 3 (the insulating film 11).

Next, one example of a method of manufacturing the organic EL device 13 will be described.

The anode 13a is patterned over the insulating film 11. Examples of a material for the anode 13a include a double-layered structure of ITO/AgPdCu. For example, an insulating layer 15 is formed using a photosensitive polyimide film, in order to define positions to form the hole transport layer 13b, the light emitting layer 13c, and the electron transport layer 13d.

The hole transport layer 13b, the light emitting layer 13c, and the electron transport layer 13d are formed in the stated order using the same mask by evaporation, for example. Then, the cathode 13e is formed by evaporation, for example, after changing the mask. Examples of a material for the cathode 13e include an MgAg alloy.

In this embodiment, the organic EL device may be, for example, of the top-emission type that emits light toward a side opposite of the organic EL substrate base material, or may be of a bottom-emission type that emits light toward the organic EL substrate base material. Alternatively, the organic EL device may take any configuration as long as the light emitting layer provided between the anode and the cathode emits light.

Referring back to FIG. 1 and FIG. 2, the description of the organic EL substrate 1 will be continued.

The insulating film 11 has a connecting hole through which the anode 13a of the organic EL device 13 and the electrode wiring 9 are electrically connected. The anode 13a is electrically connected to the semiconductor device 5 via the electrode wiring 9.

On the insulating film 11, there is provided metal wiring, a part of which constitutes an electrode pad 17. Covering the metal wiring, the organic EL device 13, and the insulating layer 15, a protection layer 19 is formed over the insulating film 11. The protection layer 19 has light permeability. Examples of the protection layer 19 include a silicon nitride film formed by chemical vapor deposition (CVD) using a low-temperature mask, and an organic sealing layer material formed by mask evaporation.

The organic EL substrate 1 includes the above described components.

The protection layer 19 may satisfy both the moisture permeability resistance and the oxygen permeability resistance as it is, if the quality of the protection layer 19 is favorable. However, there is a problem specific to organic EL devices that it is not possible to raise the temperature for film formation when forming a film over the organic EL device 13. Therefore, it is generally not possible to satisfy the moisture permeability resistance and the oxygen permeability resistance that are required only with the protection layer 19.

Thus, the organic EL light emitting device is provided with a sealing layer 21 that is joined to the organic EL substrate 1, so as to cover the organic EL device 13. The sealing layer 21 is made of a silicon dioxide film formed by CVD or sputtering. The sealing layer 21 is joined to the organic EL substrate 1 with an adhesive agent 23. Between the organic EL substrate 1 and the sealing layer 21, a void 24 is defined.

According to the organic EL light emitting device of this embodiment, as the sealing layer 21 is made of a silicon dioxide film formed by CVD or sputtering, it is possible to seal the organic EL device without using a glass substrate as the sealing layer. With this, it is possible to provide an organic EL light emitting device that is highly productive with low cost and high processing accuracy, as compared to a case in which a glass substrate is used as the sealing layer.

Figure 3:
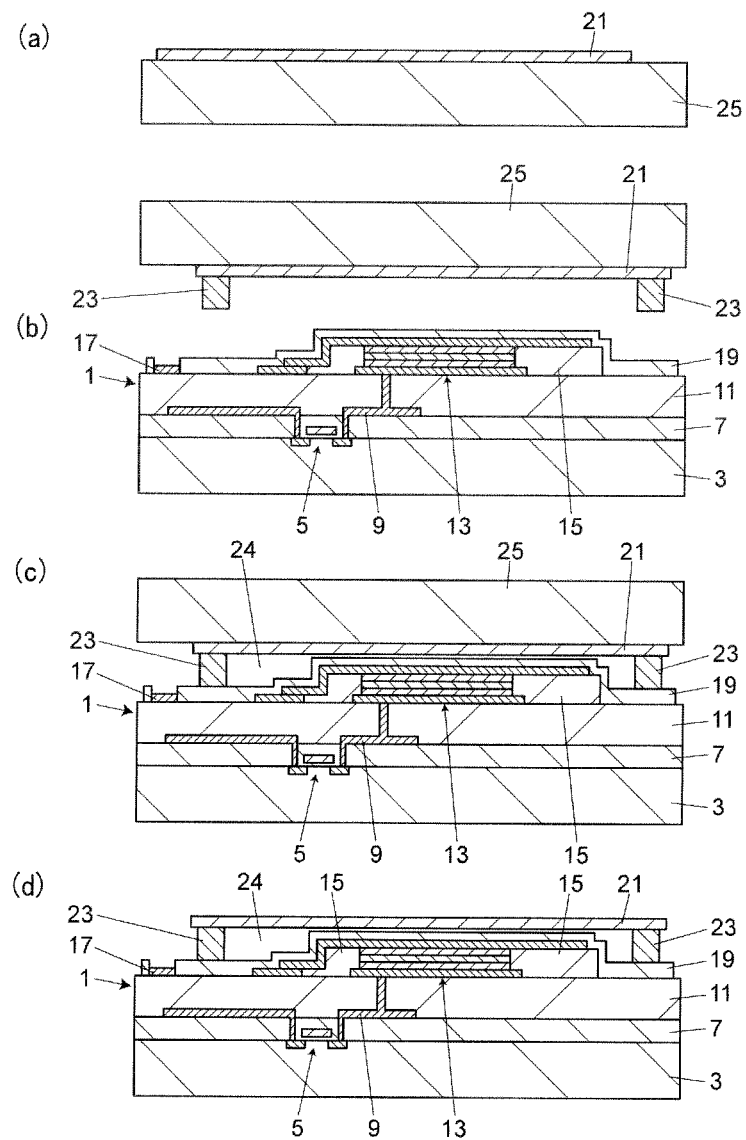
FIG. 3 is a schematic sectional view illustrating a method of manufacturing the organic EL light emitting device of FIG. 1, according to an embodiment of the present invention.

FIG. 3 is a schematic sectional view illustrating a method of manufacturing the organic EL light emitting device, according to an embodiment of the present invention. This embodiment is one example of the method of manufacturing the organic EL light emitting device shown in FIG. 3. The manufacturing method of this embodiment will be described with reference to FIG. 3. Numbers in parentheses of the following steps correspond to numbers in parentheses in FIG. 3.

Referring to FIG. 3(a), the sealing layer 21 is formed over a sealing layer base material 25. Examples of the scaling layer base material 25 include a silicon substrate. The sealing layer 21 is formed by CVD or sputtering. As the sealing layer base material 25 withstands a high temperature, it is possible to form the sealing layer 21 made of a high-quality (high-density) silicon dioxide film.

The sealing layer 21 is left at only required portions by photoengraving and etching. As the sealing layer 21 is patterned using photoengraving and etching, a highly-accurate pattern for the sealing layer 21 may be provided.

As illustrated in FIG. 3(b), the adhesive agent 23 is applied over the sealing layer 21 at a portion corresponding to a portion around the organic EL device 13 of the organic EL substrate 1. The sealing layer 21 and the organic EL substrate 1 are positioned so as to face each other, and the sealing layer base material 25 is placed over the organic EL substrate 1.

Referring to FIG. 3(c), the organic EL substrate 1 is joined with the sealing layer 21. The sealing layer 21 is joined to the protection layer 19 of the organic EL substrate 1 with the adhesive agent 23.

Referring to FIG. 3(d), the sealing layer base material 25 is removed and the sealing layer 21 is left. The sealing layer base material 25 is easily removed by dry etching using a fluorine-based gas, for example, if the material is silicon. As the sealing layer 21 made of a silicon dioxide film may not be etched by the dry etching, the sealing layer 21 remains.

After the removal of the sealing layer base material 25 that blocks light, only the light-permeable protection layer 19 and the sealing layer 21 made of a light-permeable silicon dioxide film are left on the organic EL device 13. With this, it is possible to direct the light emitted from the top-emission organic EL device 13 outside through the sealing layer 21.

As the organic EL device 13 is protected by the sealing layer 21 made of a high-quality silicon dioxide film in this manner, it is possible to realize a highly-reliable organic EL light emitting device without using a glass substrate as the sealing layer.

Figure 4:
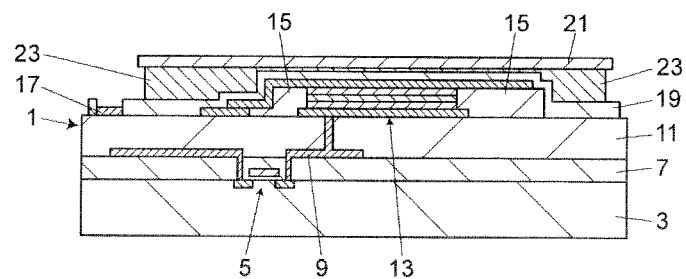
FIG. 4 is a schematic sectional view illustrating an organic EL light emitting device, according to an embodiment of the present invention.

FIG. 4 is a schematic sectional view illustrating an organic EL light emitting device, according to an embodiment of the present invention. Like components in FIG. 4 that serve the same functions as those in FIG. 1 are denoted by like reference numerals.

In this embodiment, an organic EL substrate 1 and a sealing layer 21 are joined by surface adhesion. Above the organic EL device 13, an adhesive agent 23 is disposed between the organic EL substrate 1 and the sealing layer 21. In this embodiment, there is no void between the organic EL substrate 1 and the sealing layer 21, and therefore mechanical strength is increased as compared to the embodiment shown in FIG. 1.

Figure 5:
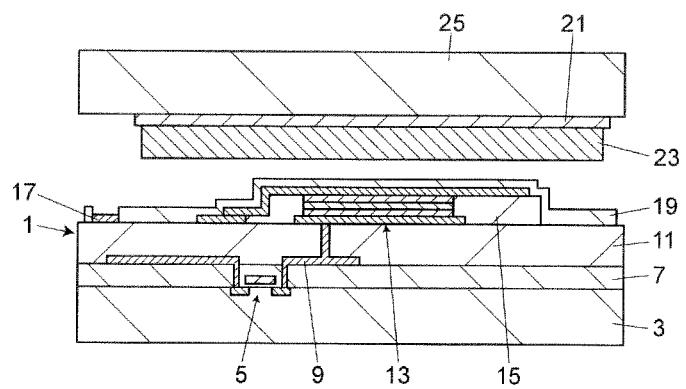
FIG. 5 is a schematic sectional view illustrating a step in a method of manufacturing the organic EL light emitting device of FIG. 4, according to an embodiment of the present invention.

In this embodiment, for example, a region to which the adhesive agent 23 is applied in the step described with reference to FIG. 3(b) is changed as shown in FIG. 5. With this, the organic EL light emitting device according to this embodiment can be manufactured in a manner similarly to the steps described with reference to FIG. 3(a) to (d), except for replacement of FIG. 3(b) with FIG. 5.

Figure 6:
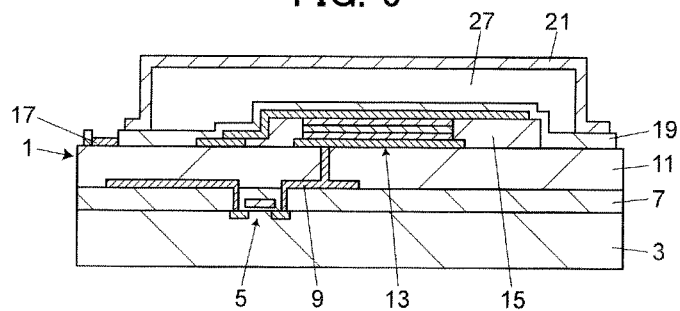
FIG. 6 is a schematic sectional view illustrating an organic EL light emitting device, according to an embodiment of the present invention.

FIG. 6 is a schematic sectional view illustrating an organic EL light emitting device, according to an embodiment of the present invention. Like components in FIG. 6 that serve the same functions as those in FIG. 1 are denoted by like reference numerals.

In this embodiment, an organic EL substrate 1 and a sealing layer 21 are joined without any adhesive agent. The sealing layer 21 is formed in a convexed manner, and there is a void between the organic EL substrate 1 and the sealing layer 21.

A position for the joining portion between the organic EL substrate 1 and the sealing layer 21 is different from a position for providing an organic EL device 13. The sealing layer 21 is joined to an insulating film 11 of the organic EL substrate 1. The sealing layer 21 and the insulating film 11 are joined by direct joining, e.g., room-temperature joining.

In room-temperature joining, an ion beam is directed to a substrate surface subject for joining, in high vacuum. The ion beam may be directed to the substrate surface to activate, thus forming dangling-bonds that are ready to bond to another surface. More specifically, the activated surfaces can be joined together with a strong bond, such as with the atomic-level bond, without requiring heat or without adhesive agent, even the surfaces are made of different materials. Since no heat is required, the substrate surfaces can be joined by room-temperature joining, even after the integrated circuit is formed.

In this embodiment, the organic EL substrate 1 and the sealing layer 21 are joined by direct joining without using any adhesive agent, and therefore it is possible to prevent moisture from coming into the organic EL device 13 via the adhesive agent as compared to the embodiment shown in FIG. 1.

Figure 7:
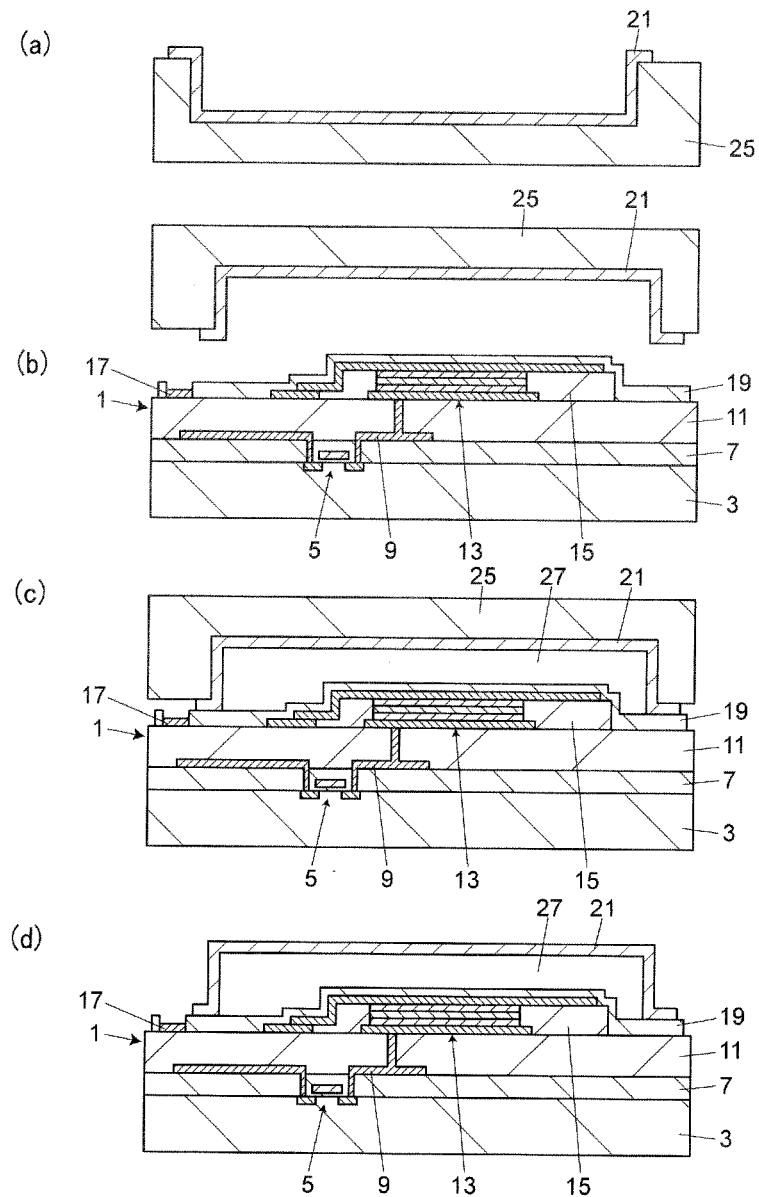
FIG. 7 is a schematic sectional view illustrating a method of manufacturing the organic EL light emitting device of FIG. 6, according to an embodiment of the present invention.

FIG. 7 is a schematic sectional view illustrating a method of manufacturing the organic EL light emitting device of FIG. 6, according to an embodiment of the present invention. This embodiment is one example of the method of manufacturing the organic EL light emitting device shown in FIG. 6. The manufacturing method of this embodiment will be described with reference to FIG. 7. Numbers in parentheses of the following steps correspond to numbers in parentheses in FIG. 7.

Referring to FIG. 7(a), for example, using photoengraving and the etching, a depressed portion is provided in a sealing layer base material 25 made of silicon at a position corresponding to a position for providing an organic EL device 13 of an organic EL substrate 1. Examples of the etching technique for providing the depressed portion include, but not limited to, dry etching and wet etching using KOH.

A sealing layer 21 is formed over the sealing layer base material 25 by CVD or sputtering. The sealing layer 21 is provided with a depressed portion at a position corresponding to the position for providing the organic EL device 13 of the organic EL substrate 1 due to the depressed portion in the sealing layer base material 25.

The sealing layer 21 is left at only required portions by photoengraving and etching. As the sealing layer 21 is patterned using photoengraving and etching, a highly-accurate pattern for the sealing layer 21 may be provided.

Referring to FIG. 7(b), the sealing layer 21 and the organic EL substrate 1 are positioned so as to face each other, and the sealing layer base material 25 is placed over the organic EL substrate 1.

Referring to FIG. 7(c), the organic EL substrate 1 is joined with the sealing layer 21. The sealing layer 21 is joined to a protection layer 19 at a position different from the position for providing the organic EL device 13 of the organic EL substrate 1. With this, a void 27 is provided between the organic EL substrate 1 and the sealing layer 21 due to the depressed portion in the sealing layer 21.

As both an organic EL substrate base material 3 for the organic EL substrate 1 and the sealing layer base material 25 constituting the sealing layer 21 are made of a silicon substrate, a surface of the sealing layer 21 and a surface of the protection layer 19 are favorable in flatness. Therefore, the organic EL substrate 1 and the sealing layer 21 may be joined by direct joining using the room-temperature joining technique.

Referring to FIG. 7(d), the sealing layer base material 25 is removed and the sealing layer 21 is left. The sealing layer base material 25 is easily removed by dry etching using a fluorine-based gas, for example, if the material is silicon. As the sealing layer 21 made of a silicon dioxide film may not be etched by the dry etching, the sealing layer 21 remains.

As the organic EL device 13 is protected by the scaling layer 21 made of a high-quality silicon dioxide film in this manner, it is possible to realize a highly-reliable organic EL light emitting device without using a glass substrate as the sealing layer.

Further, for example, as the organic EL substrate 1 and the sealing layer 21 are joined by direct joining without using an adhesive agent made of an organic material, it is possible to prevent moisture from coming through the joining portion between the organic EL substrate 1 and the sealing layer 21. Moreover, as it is possible to prevent moisture from coming through the joining portion, it is possible to decrease an area of the joining portion between the organic EL substrate 1 and the sealing layer 21 (margin for adhesive), and thus to downsize the organic EL light emitting device.

Figure 8:
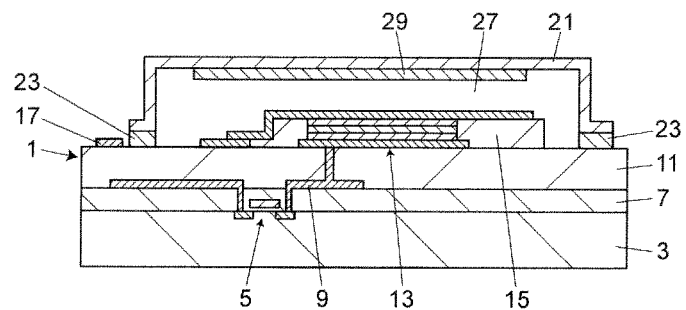
FIG. 8 is a schematic sectional view illustrating an organic EL light emitting device, according to an embodiment of the present invention.

FIG. 8 is a schematic sectional view illustrating an organic EL light emitting device, according to an embodiment of the present invention. Like components in FIG. 8 that serve the same functions as those in FIG. 1 and FIG. 6 are denoted by like reference numerals.

In this embodiment, as compared to the organic EL light emitting device shown in FIG. 6, a protection layer 19 is not provided and a sealing layer 21 is joined to an insulating film 11 with an adhesive agent 23 interposed therebetween. Further, in this embodiment, a drying material 29 for adsorbing moisture is provided within a void 27. The drying material 29 is provided on the sealing layer 21. Examples of the drying material 29 include calcium oxide and copper chloride.

According to this embodiment, as the drying material 29 is provided within the void 27, the quality of an organic EL device 13 is protected even if a small amount of moisture comes through the joining portion between the organic EL substrate 1 and the sealing layer 21. With this, according to this embodiment, it is possible to realize a high-quality organic EL light emitting device.

While the organic EL substrate 1 is joined to the sealing layer 21 by the adhesive agent 23 in this embodiment, the organic EL substrate 1 and the sealing layer 21 may be joined by direct joining. In addition, similarly to the organic EL light emitting device shown in FIG. 1 and the organic EL light emitting device shown in FIG. 6, the organic EL substrate 1 may be provided with the protection layer 19.

Further, the configuration in which the drying material 29 is provided within the void 27 may be applied to any embodiment other than this embodiment. Moreover, in the embodiment shown in FIG. 1, a drying material may be provided within a void 24. The method of providing the drying material within the void 24 may be realized, for example, by forming the sealing layer 21 on a sealing layer base material 25, and then providing the drying material over the sealing layer 21 before joining the sealing layer 21 to the organic EL substrate 1.

Figure 9:
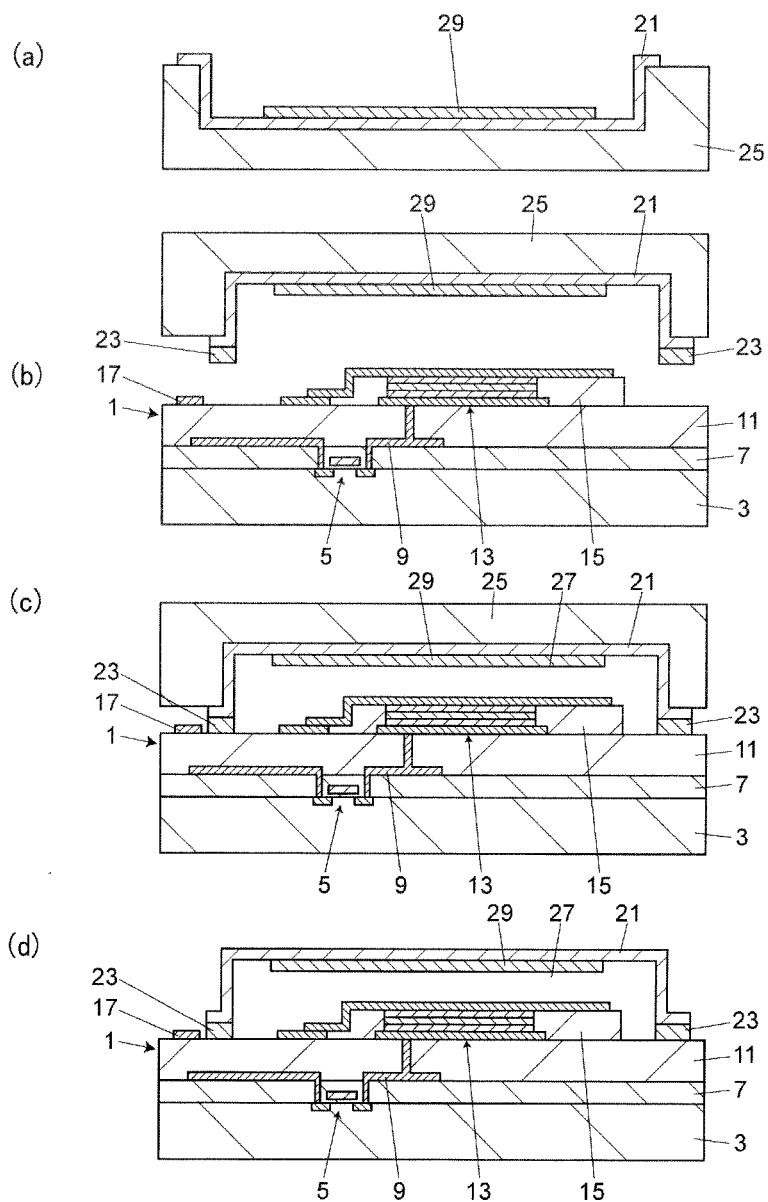
FIG. 9 is a schematic sectional view illustrating a method of manufacturing the organic EL light emitting device of FIG. 8, according to an embodiment of the present invention.

FIG. 9 is a schematic sectional view illustrating a method of manufacturing the organic EL light emitting device of FIG. 8. This embodiment is one example of the method of manufacturing the organic EL light emitting device shown in FIG. 8. The manufacturing method of this embodiment will be described with reference to FIG. 9. Numbers in parentheses of the following steps correspond to numbers in parentheses in FIG. 9.

Referring to FIG. 9(a), similarly to the step described with reference to FIG. 7(a), a sealing layer 21 having the depressed portion in a sealing layer base material 25 at the position corresponding to the position for providing an organic EL device 13 of an organic EL substrate 1 is formed over the sealing layer base material 25. A drying material 29 is formed within the depressed portion in the sealing layer 21 using an ink-jet technology, for example. The method of forming the drying material 29 is not limited to the ink-jet technology, and may be any method.

Referring to FIG. 9(b), the adhesive agent 23 is applied over the sealing layer 21 at a portion corresponding to a portion around the organic EL device 13 of the organic EL substrate 1. The sealing layer 21 and the organic EL substrate 1 are positioned so as to face each other, and the sealing layer base material 25 is placed over the organic EL substrate 1.

Referring to FIG. 9(c), the organic EL substrate 1 is joined with the sealing layer 21. The sealing layer 21 is joined to an insulating film 11 with an adhesive agent 23 interposed therebetween at a position different from the position for providing the organic EL device 13 of the organic EL substrate 1. With this, the drying material 29 is provided within a void 27 between the organic EL substrate 1 and the sealing layer 21.

Referring to FIG. 9(d), the sealing layer base material 25 is removed and the sealing layer 21 is left. The sealing layer base material 25 is easily removed by dry etching using a fluorine-based gas, for example, if the material is silicon. As the sealing layer 21 made of a silicon dioxide film may not be etched by the dry etching, the sealing layer 21 remains.

Figure 10:
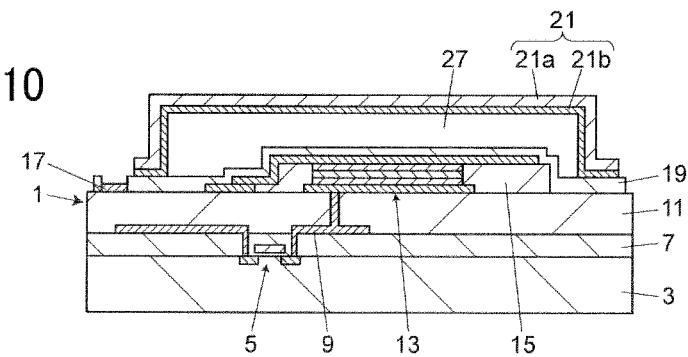
FIG. 10 is a schematic sectional view illustrating an organic EL light emitting device, according to an embodiment of the present invention.

FIG. 10 is a schematic sectional view illustrating an organic EL light emitting device, according to an embodiment of the present invention. Like components in FIG. 10 that serve the same functions as those in FIG. 1 and FIG. 6 are denoted by like reference numerals.

This embodiment is different from the organic EL light emitting device shown in FIG. 6 in that a sealing layer 21 is configured as a double-layered structure having a silicon dioxide film ($SiO_2$) 21a and a silicon nitride film (SiN) 21b. The silicon dioxide film 21a and the silicon nitride film 21b are formed by CVD or sputtering.

At the joining portion between an organic EL substrate 1 and the sealing layer 21, a protection layer 19 and the silicon nitride film 21b are joined by direct joining. Here, it is preferable that a topmost layer of the protection layer 19 is a silicon nitride film formed by low-temperature CVD or low-temperature sputtering. This is because in the room-temperature joining, joining strength between members made of the same material is higher than that between members made of different materials.

The sealing layer 21 may be configured such that the silicon dioxide film 21a and the silicon nitride film 21b are layered in an opposite order so that the silicon dioxide film 21a is joined to the protection layer 19.

While the silicon dioxide film 21a formed by the semiconductor technique is high-quality, the silicon nitride film 21b has a higher moisture barrier property in view of the moisture permeability. Therefore, according to this embodiment, it is possible to prevent the deterioration of an organic EL device 13 due to the moisture, and to realize an organic EL light emitting device having higher quality.

Figure 11:
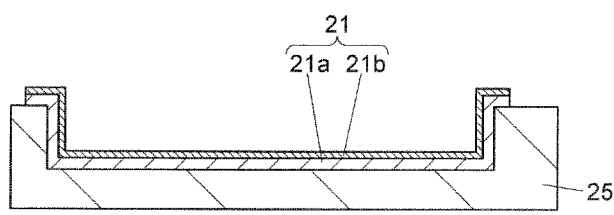
FIG. 11 is a schematic sectional view illustrating a step in a method of manufacturing the organic EL light emitting device of FIG. 10, according to an embodiment of the present invention.

The organic EL light emitting device according to this embodiment can be manufactured, for example, by adding a step of forming the silicon nitride film 21b after forming the silicon dioxide film 21a and before patterning the sealing layer 21 in the step described with reference to FIG. 7(a) (see FIG. 11). With this, the organic EL light emitting device according to this embodiment can be manufactured in a manner similarly to the steps described with reference to FIG. 7(a) to (d).

Figure 12:
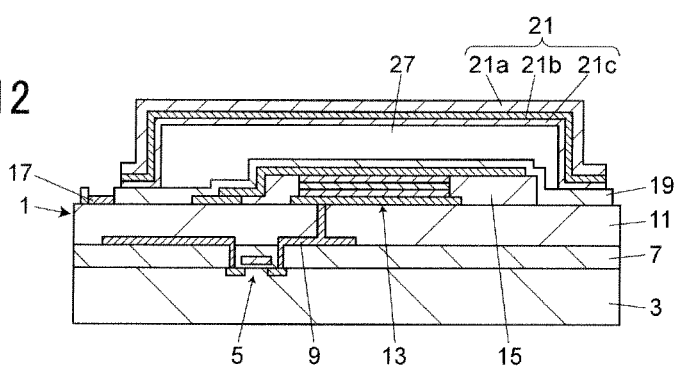
FIG. 12 is a schematic sectional view illustrating an organic EL light emitting device, according to an embodiment of the present invention.

FIG. 12 is a schematic sectional view illustrating an organic EL light emitting device, according to an embodiment of the present invention. Like components in FIG. 12 that serve the same functions as those in FIG. 1, FIG. 6, and FIG. 10 are denoted by like reference numerals.

This embodiment is different from the organic EL light emitting device shown in FIG. 10 in that a sealing layer 21 further includes a silicon dioxide film ($SiO_2$) 21c. The sealing layer 21 is configured as a three-layered structure of a silicon dioxide film 21a, a silicon nitride film 21b, and the silicon dioxide film 21c. The silicon dioxide film 21a, the silicon nitride film 21b, and the silicon dioxide film 21c are formed by CVD or sputtering.

At the joining portion between an organic EL substrate 1 and the sealing layer 21, a protection layer 19 and the silicon dioxide film 21c are joined by direct joining. Here, it is preferable that the topmost layer of the protection layer 19 is a silicon dioxide film formed by low-temperature CVD or low-temperature sputtering. As joining strength between silicon dioxide films in the room-temperature joining is high, it is possible to realize an organic EL light emitting device having higher quality.

Figure 13:
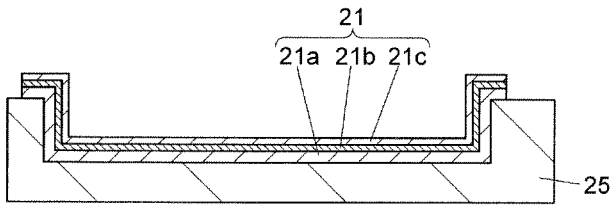
FIG. 13 is a schematic sectional view illustrating a step in a method of manufacturing the organic EL light emitting device, according to an embodiment of the present invention.

The organic EL light emitting device according to this embodiment can be manufactured, for example, by adding a step of forming the silicon nitride film 21b and a step of forming the silicon dioxide film 21c in the step described with reference to FIG. 7(a) (see FIG. 13). The step of forming the silicon nitride film 21b and the step of forming the silicon dioxide film 21c are performed after forming the silicon dioxide film 21a and before patterning the sealing layer 21. With this, the organic EL light emitting device according to this embodiment can be manufactured in a manner similarly to the steps described with reference to FIG. 7(a) to (d).

Figure 14:
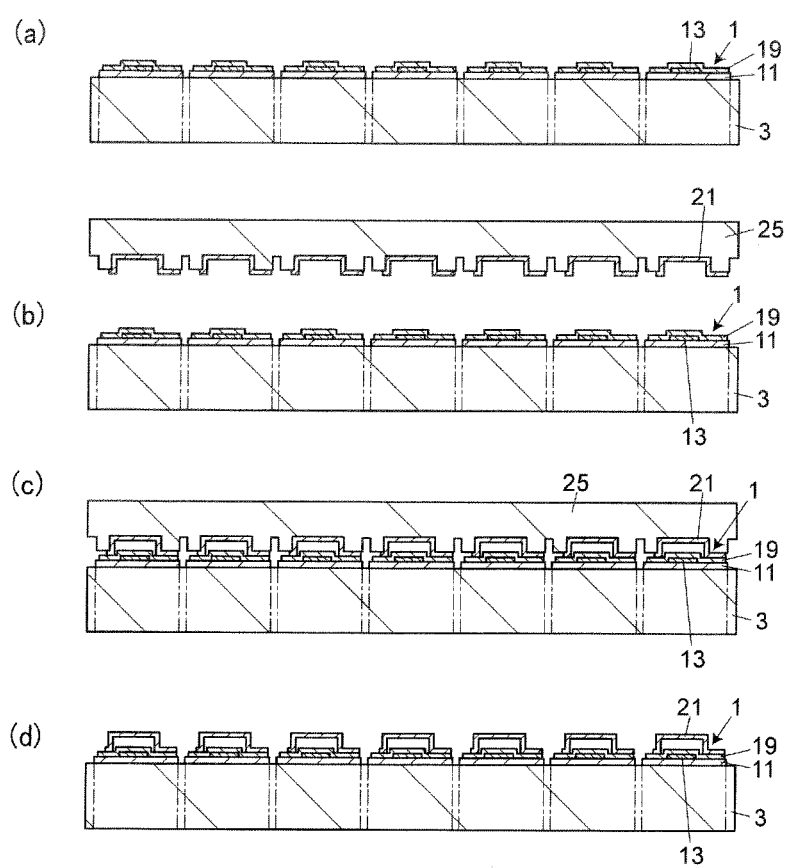
FIG. 14 is a schematic sectional view illustrating a method of manufacturing the organic EL light emitting device of FIG. 6, according to an embodiment of the present invention.

FIG. 14 is a schematic sectional view illustrating a method of manufacturing the organic EL light emitting device, according to an embodiment of the present invention. In this embodiment, both of joining of the sealing layer and removal of the sealing layer base material are performed collectively for regions of a plurality of organic EL light emitting devices. This embodiment is one example of the method of manufacturing the organic EL light emitting device shown in FIG. 6.

However, the manufacturing method in which both of the joining of sealing layer and the removal of the sealing layer base material are performed collectively for the regions of the plurality of organic EL light emitting devices may be applied not limited to the manufacturing of the organic EL light emitting device shown in FIG. 6, but to the manufacturing of the organic EL light emitting devices of other embodiments and the organic EL light emitting device according to the present invention.

The manufacturing method of this embodiment will be described with reference to FIG. 14. Numbers in parentheses of the following steps correspond to numbers in parentheses in FIG. 14.

Referring to FIG. 14(a), regions of a plurality of organic EL substrates 1 are formed on a single organic EL substrate base material 3. The organic EL substrate base material 3 is an 8-inch silicon wafer, for example. A protection layer 19 is made of a material that can be selectively left when etching to silicon, such as a silicon dioxide film, a silicon nitride film, and a layered film of the silicon dioxide film and the silicon nitride film.

Referring to FIG. 14(b), a plurality of sealing layers 21 are formed on a sealing layer base material 25. The sealing layer base material 25 is an 8-inch silicon wafer, for example, which is in the same size as the organic EL substrate base material 3. The sealing layers 21 are provided on the sealing layer base material 25 so as to correspond respectively to positions of the regions of the organic EL substrates 1 on the organic EL substrate base material 3.

The sealing layer base material 25 provided with the plurality of the sealing layers 21 is positioned above the organic EL substrate base material 3 such that the sealing layer 21 faces against the protection layer 19. As the sealing layer base material 25 and the organic EL substrate base material 3 are in the same size, positioning between the sealing layer base material 25 and the organic EL substrate base material 3 is easy.

Referring to FIG. 14(c), the sealing layers 21 are joined to the regions of the plurality of the organic EL substrates 1, respectively and collectively. Each sealing layer 21 is joined to the protection layer 19 for each region of the organic EL substrate 1 by room-temperature joining, for example. As the sealing layers 21 are joined to the regions of the plurality of the organic EL substrates 1 collectively, time required for joining of the sealing layers 21 to the regions of the plurality of the organic EL substrates 1 is reduced as compared to a case in which the sealing layers 21 are joined to the regions of the organic EL substrates 1 one by one.

Referring to FIG. 14(d), the sealing layer base material 25 is removed and the sealing layer 21 is left. In this state, it is possible to dice the organic EL substrate base material 3 constituted as a silicon wafer using a normal dicing machine or a laser dicing machine.

Thus, the organic EL substrate base material 3 is diced into dies using a dicing technique, and organic EL light emitting devices each having the sealing layer 21 and the diced organic EL substrate 1. In this manner, by forming the sealing layers 21 for the regions of the plurality of organic EL substrates 1 collectively, it is possible to provide an organic EL light emitting device that is highly productive.

Figure 15:
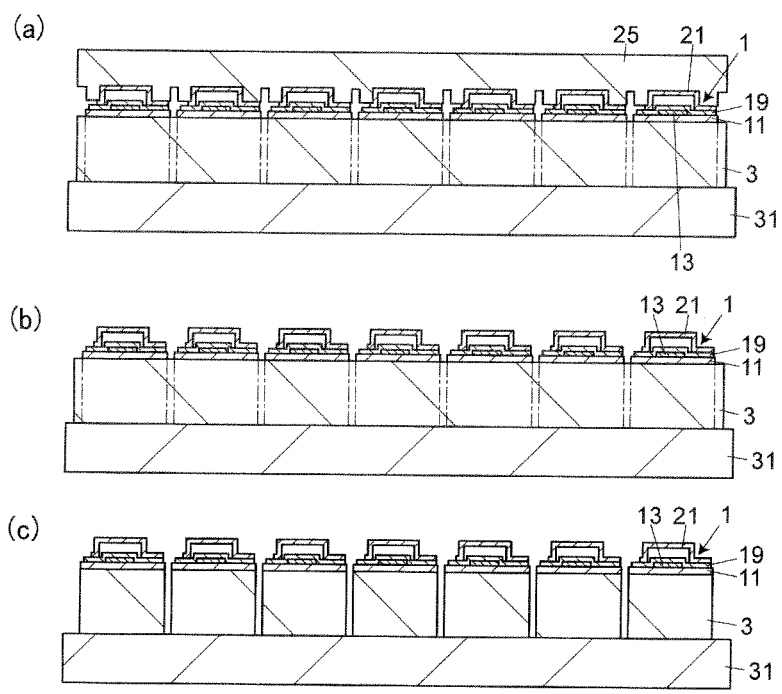
FIG. 15 is a schematic sectional view illustrating a method of manufacturing the organic EL light emitting device of FIG. 6, according to an embodiment of the present invention.

FIG. 15 is a schematic sectional view illustrating a method of manufacturing the organic EL light emitting device, according to an embodiment of the present invention. In this embodiment, both of joining of the sealing layer and removal of the sealing layer base material are performed collectively for regions of a plurality of organic EL light emitting devices. This embodiment is one example of the method of manufacturing the organic EL light emitting device shown in FIG. 6.

Referring to FIG. 6(a), similarly to the steps described with reference to FIG. 14(a) to (c), sealing layers 21 are joined to the regions of a plurality of organic EL substrates 1, respectively and collectively. Then, a supporting substrate 31 is applied to a back side of an organic EL substrate base material 3 (a side opposite from the side on which an organic EL device 13 is formed). The supporting substrate 31 may be made of any material that can be used in normal dicing, and for example, a resin film.

Referring to FIG. 6(b), etching is performed to a sealing layer base material 25 and the organic EL substrate base material 3 that are made of silicon by dry etching. In the etching, an ICP etching device is used, for example. FIG. 14(b) shows a state in which the sealing layer base material 25 is removed.

Referring to FIG. 6(c), the dry etching is continued even after the sealing layer base material 25 has been removed, and the organic EL substrate base material 3 is subjected to etching. Portions of the organic EL substrate base material 3 that are not covered by an insulating film 11 are etched substantially vertically by the ICP etching device.

The organic EL substrate base material 3 is removed at portions around the regions of the organic EL substrates 1, and the organic EL substrates 1 are diced into pieces. With this, a plurality of organic EL light emitting devices each having the diced organic EL substrate 1 and the sealing layer 21 are obtained.

The dicing of the organic EL substrate base material 3 into pieces using dry etching is realized based on processing accuracy of the insulating film 11, that is, processing accuracy of photoengraving using a stepper. Therefore, by dicing the organic EL substrate 1 into pieces using dry etching, it is possible to provide accurate processing in terms of accuracy in dimensions of the diced organic EL substrates 1 as compared to a case in which the organic EL substrate 1 are diced using a dicing machine or the like. With this, it is possible to provide an organic EL light emitting device with highly-accurate dimensions.

Further, by performing the removal of the sealing layer base material 25 and the dicing of the plurality of organic EL substrates 1 successively using dry etching, time required for these processes is reduced as compared to a case in which these processes are not performed successively. With this, it is possible to provide an organic EL light emitting device that is highly productive.

Figure 16:
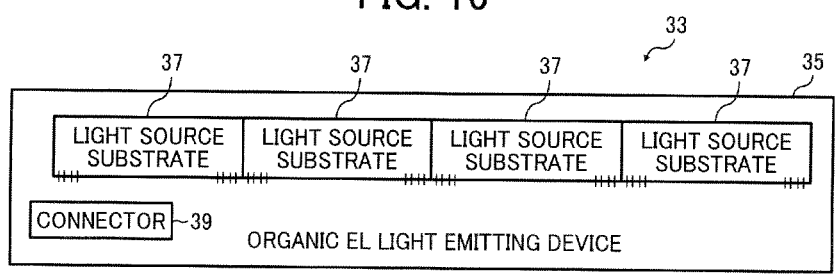
FIG. 16 is a schematic plan view illustrating an organic EL light source device, according to an embodiment of the present invention.
Figure 17:
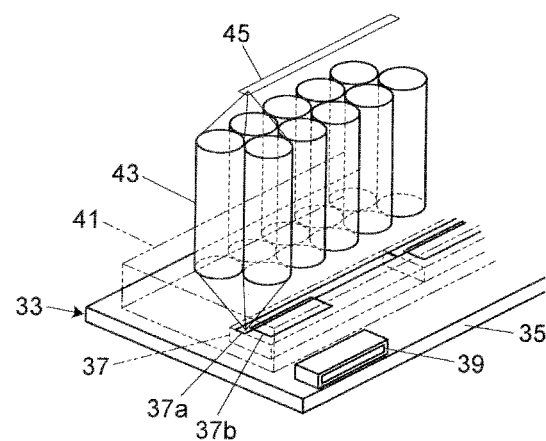
FIG. 17 is a schematic perspective view illustrating an exposure device employing the organic EL light source device of FIG. 16.

FIG. 16 is a schematic plan view illustrating one embodiment of an organic EL light source device. FIG. 17 is a schematic perspective view illustrating an exposure device employing the organic EL light source device according to this embodiment.

An organic EL light source device 33 is provided with a light source substrate 35 and a plurality of organic EL light emitting devices 37 mounted on the light source substrate 35. The light source substrate 35 is provided with a connector 39 for inputting an external electrical signal or power to the organic EL light emitting device 37.

The organic EL light emitting device 37 is configured as the organic EL light emitting device according to the present invention. A terminal of the organic EL light emitting device 37 is electrically connected to a terminal of the light source substrate 35 via a bonding wire, for example. The organic EL light emitting device 37 includes a light emitter 37a having a plurality of organic EL devices arranged thereon, and a drive circuit 37b for controlling driving of the light emitter 37a.

In the exposure device, a spacer glass 41 is disposed above the organic EL light emitting device 37. Above the spacer glass 41, a SELFOC (registered trademark) lens array 43 is disposed. Light emitted from each of the organic EL devices arranged on the light emitter 37a of the organic EL light emitting device 37 produces an image at an image forming spot 45 via the spacer glass 41 and the SELFOC lens array 43. Such an exposure device is disclosed in Patent Documents 5 and 6.

As illustrated in FIG. 17, in a case in which a nonmagnification optical system is used, it is necessary that the length of the light emitter 37a is the same as the width of an image to be formed. For example, if the organic EL light source device 33 is for forming an image of an A3-size area (297 mm), the light emitter 37a is also A3-size. As it is not easy to produce the organic EL light emitting device 37 of A3-size, as shown in FIG. 16, costs of manufacturing by arranging the plurality of organic EL light emitting devices 37 is lower.

However, when arranging the plurality of organic EL light emitting devices 37, accuracy of connection between adjacent ones of the organic EL light emitting devices 37 becomes problematic. Low accuracy of the connection may result in a gap or misplacement in a printed matter.

Figure 18:
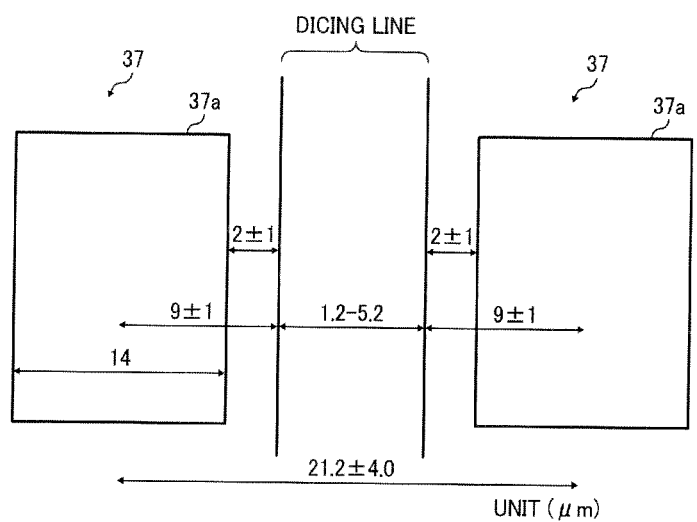
FIG. 18 is an illustration of an example of dimensions of the organic EL light emitting device.

FIG. 18 is an illustration of an example of dimensions of the organic EL light emitting device.

It is required that accuracy of dimensions such that the length between an end of the organic EL light emitting device 37 (dicing line) and an end of the light emitter 37a (organic EL device) is 2±1 μm (micrometer) when the organic EL light emitting device 37 is applied to a 1200 dpi (dots per inch) exposure device, for example. The accuracy of dimensions affects the accuracy of the connection when the plurality of organic EL light emitting devices 37 are arranged.

This accuracy is not realized by normal glass processing when a glass substrate is used as the sealing layer in the conventional technique. By contrast, the organic EL light emitting device according to the present invention employs the sealing layer that is formed by chemical vapor deposition, physical vapor deposition, or both of these, and therefore allows highly-accurate processing that realizes the above accuracy. Further, as it is not necessary to use a glass substrate as the sealing layer, the cost can be reduced.

While the embodiments of the present invention have been described above, the values, the materials, the arrangement, the numbers, and the like are mere examples, and the present invention is not limited to such examples, and may be altered in various manners within the scope of the present invention as defined in the appended claims.

For example, while the silicon substrate is taken as an example of the organic EL substrate base material 3 in the above embodiments, the organic EL substrate base material of the present invention may be made of a different material such as glass or resin.

Further, while the semiconductor device 5 is formed on the organic EL substrate 1 in the above embodiments, the organic EL substrate may be provided with only an organic EL device or devices other than the semiconductor device.

Moreover, while the sealing layer 21 is formed by CVD or sputtering, the sealing layer may be formed by physical vapor deposition instead of sputtering.

In addition, while the organic EL substrate 1 and the sealing layer 21 are joined by the adhesive agent 23 or by the room-temperature joining, direct joining other than the room-temperature joining, or indirect joining using an adhesion layer other than the adhesive agent may be used in another embodiment to join the organic EL substrate and the sealing layer.

Further, the sealing layer 21 is configured as, but not limited to, one of the single-layer structure of the silicon dioxide film, the layered structure of the silicon dioxide film 21a and the silicon nitride film 21b, and the layered structure of the silicon dioxide film 21a, the silicon nitride film 21b, and the silicon dioxide film 21c. The sealing layer of the present invention may be made of a light permeable material formed by one or both of chemical vapor deposition and physical vapor deposition.

Moreover, an application of the organic EL light emitting device of the present invention is not limited to the exposure device.

In the method of manufacturing the organic EL light emitting device of the present invention, the removing the sealing layer base material is not limited to dry etching, and any method may be employed as long as it is possible to remove the sealing layer base material and leave the sealing layer.

What is claimed is:

1. A method of manufacturing an organic EL light emitting device, the method comprising the steps of: forming a sealing layer over a sealing layer base material by using at least one of chemical vapor deposition and physical vapor deposition; joining the sealing layer to an organic EL substrate having an organic EL device so as to cover the organic EL device; and removing the sealing layer base material over the sealing layer, to leave the sealing layer that covers the organic EL device, wherein the sealing layer has a depressed portion at a position corresponding to a position at which the organic EL device is provided, and the sealing layer is joined at a position on the organic EL substrate different from the position at which the organic EL device is provided, such that the depressed portion defines a void between the organic EL substrate and the sealing layer.

2. The method of manufacturing the organic EL light emitting device according to claim 1, wherein
the sealing layer base material is made of silicon, and
the removing removes the sealing layer base material by etching.

3. The method of manufacturing the organic EL light emitting device according to claim 1, wherein the organic EL substrate and the sealing layer are joined by direct joining.

4. The method of manufacturing the organic EL light emitting device according to claim 1, wherein, when an organic EL substrate base material having regions in which a plurality of the organic EL substrates is formed,
using the sealing layer base material of a size as large as the organic EL substrate base material, the joining the sealing layer and the removing the sealing layer base material are performed collectively for regions of a plurality of the organic EL light emitting devices.

5. The method of manufacturing the organic EL light emitting device according to claim 4, further comprising the steps of:
- etching the sealing layer base material and the organic EL substrate base material using dry etching after the joining the sealing layer; and
- dicing the regions of the plurality of organic EL substrates into pieces,
- wherein the removing the sealing layer base material and the dicing are successively performed.

* * * * *